(12) United States Patent
Hsu

(10) Patent No.: US 6,211,014 B1
(45) Date of Patent: Apr. 3, 2001

(54) THREE-DIMENSIONAL, DEEP-TRENCH, HIGH-DENSITY READ-ONLY MEMORY (ROM) AND ITS MANUFACTURING METHOD

(75) Inventor: Chen-Chung Hsu, Taichung (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/059,417

(22) Filed: Apr. 14, 1998

Related U.S. Application Data

(62) Division of application No. 08/915,400, filed on Aug. 20, 1997, now Pat. No. 6,018,186.

(30) Foreign Application Priority Data

Apr. 15, 1997 (TW) .................................................. 86104851

(51) Int. Cl.$^7$ .................................................. H01L 21/336
(52) U.S. Cl. .......................... 438/259; 438/257; 438/262; 438/264; 438/268; 438/270
(58) Field of Search .................................. 438/257, 259, 438/262–264, 268, 270; 257/390, 391, 396–398, 622

(56) References Cited

U.S. PATENT DOCUMENTS

| 4,207,585 | | 6/1980 | Rao | 357/41 |
|---|---|---|---|---|
| 5,214,303 | * | 5/1993 | Aoki | 257/390 |
| 5,329,148 | * | 7/1994 | Aoki | 257/390 |
| 5,455,190 | * | 10/1995 | Hsu | 438/270 |
| 5,652,162 | * | 7/1997 | Liao | 438/276 |
| 5,851,879 | * | 12/1998 | Lin et al. | 438/257 |
| 5,895,242 | * | 4/1999 | Wen | 438/275 |
| 5,933,748 | * | 8/1999 | Chou et al. | 438/431 |
| 5,973,375 | * | 10/1999 | Baukus et al. | 257/399 |

* cited by examiner

Primary Examiner—Carl Whitehead, Jr.
Assistant Examiner—Maria Guerrero
(74) Attorney, Agent, or Firm—Finnegan, Henderson, Farabow, Garrett & Dunner, L.L.P.

(57) ABSTRACT

A three-dimensional, deep-trench, high-density ROM and its manufacturing method are provided. The ROM device comprises a silicon substrate having a plurality of parallel trenches above it surface, wherein, between every two adjacent trenches, there is a higher region. During programming of the ROM device, deeper trenches are formed to define the OFF-state non-conducting memory cells, so that misalignment problems that lead to transistor cell leakage are prevented. The ROM device provides reduced breakdown of the source/drain regions as well.

5 Claims, 4 Drawing Sheets

US 6,211,014 B1

THREE-DIMENSIONAL, DEEP-TRENCH, HIGH-DENSITY READ-ONLY MEMORY (ROM) AND ITS MANUFACTURING METHOD

This is a division of application Ser. No. 08/915,400, filed Aug. 20, 1997 now U.S. Pat. No. 6,018,186—all of which are incorporated herein by reference.

BACKGROUND OF THE INVENTION

1. Field of Invention

The present invention relates generally to read-only memories (ROMs), and more particularly to a three-dimensional, deep-trench, high-density ROM and its manufacturing method.

2. Description of Related Art

Read-only memories (ROMs) are nonvolatile semiconductor memories used in computer and microprocessor systems for permanently storing programs and data that are repeatedly used, such as BIOS (Basic Input/Output System, used in operating systems of personal computers). ROM manufacturing involves very complicated and time-consuming processes requiring costly equipment and material. Therefore, customers typically first define the data to be permanently stored in ROMs, and then provide the data to the ROM manufacturer for programming into the ROMs. The ROM manufacturer encodes the customer programs into the ROM, before delivering back the coded ROM to the customers.

A major issue for ROM manufacturers is reducing the occupation of ROM components on a surface of a semiconductor wafer, so to lower cost and increase market share. However, in conventional ROMs, the gates comprise polysilicon layers formed above the wafer surface. Gate formation necessitates the use of photo-stepper machines in which the distance between two gate polysilicon layers cannot be reduced in an efficient manner, increasing the surface area occupation of ROM components as well as manufacturing costs. Further, conventional ROM manufacturing requires ion implantation after encoding, which generates an alignment shift that leads to transistor cell leakage problems.

A conventional ROM structure is shown in FIGS. 1A–1C. FIG. 1A is a top view, FIG. 1B is a cross-sectional view taken along line IB—IB of the ROM of FIG. 1A, and FIG. 1C is a cross-sectional view taken along line IC—IC of the ROM of FIG. 1A.

Conventional ROM manufacturing includes forming source/drain regions 11 above a substrate 10, and then forming a gate oxide layer 12 and a polysilicon gate region 13 above source/drain regions 11. Regions 11 are referred to as "source/drain region" since they can act as either a source or a drain terminal depending upon the actual assignment of metallic wiring connections. Conventional ROM manufacturing further comprises forming a transistor in areas 14 enclosed by the dashed lines of FIG. 1A.

When programming is required, referring to FIG. 1C, ROM formation further comprises coating a photoresist layer 15 on polysilicon gate region 13, exposing only areas of the transistor cells where a permanent OFF-state is desired, and switching off a channel region 16 using an ion implantation operation. Since polysilicon gate regions 13 are all formed above the same planar surface of substrate 10, a definitive distance is required to isolate gate regions 13. Hence, the surface area occupation of the ROM cannot be reduced.

SUMMARY OF THE INVENTION

It is therefore an object of this invention to provide a three-dimensional, deep-trench, high-density ROM through which misalignment problems generated by imprecise focusing are avoided, reducing memory cell leakage and breakdown of the source/drain regions. It is a further object of the present invention to provide a three-dimensional ROM that greatly reduces its surface area occupation and leads to a reduction in production cost.

Still further object of the present invention is to provide a manufacturing method for forming a three-dimensional, deep-trench, high-density ROM.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

To achieve the objects and in accordance with the purpose of the invention, as embodied and broadly described herein, the invention comprises a three-dimensional, deep-trench, high-density ROM, including: a plurality of parallel bit lines formed in a silicon substrate; a plurality of word lines running perpendicular to and above the bit lines; and a plurality memory cells, each memory cell being formed at a junction of two adjacent bit lines and a portion of one of the word lines, wherein the plurality of memory cells include a plurality of OFF-state non-conducting memory cells and a plurality of ON-state conducting memory cells, and wherein a channel region of each non-conducting memory cell has a trench depth greater than the depth of the plurality bit lines.

The present invention further comprises a method for manufacturing a three-dimensional, deep-trench, high-density ROM, the method including the steps of: performing ion implantation to form a plurality of parallel bit lines on a surface of a silicon substrate;

forming a photoresist layer to expose a plurality of channel regions of the substrate where non-conducting memory cells are desired; performing an etching operation, using the photoresist layer as a mask, to form a trench in each of the channel regions, each trench having a trench depth larger than a depth of each of the bit lines; sequentially forming a gate oxide layer and a polysilicon layer on the surface of the silicon substrate; and defining the gate oxide and polysilicon layers to form a plurality of word lines that are perpendicular to the plurality of bit lines.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments of the invention and together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers will be used throughout the drawings to refer to the same or like parts.

1. First Embodiment

Figure 1A:
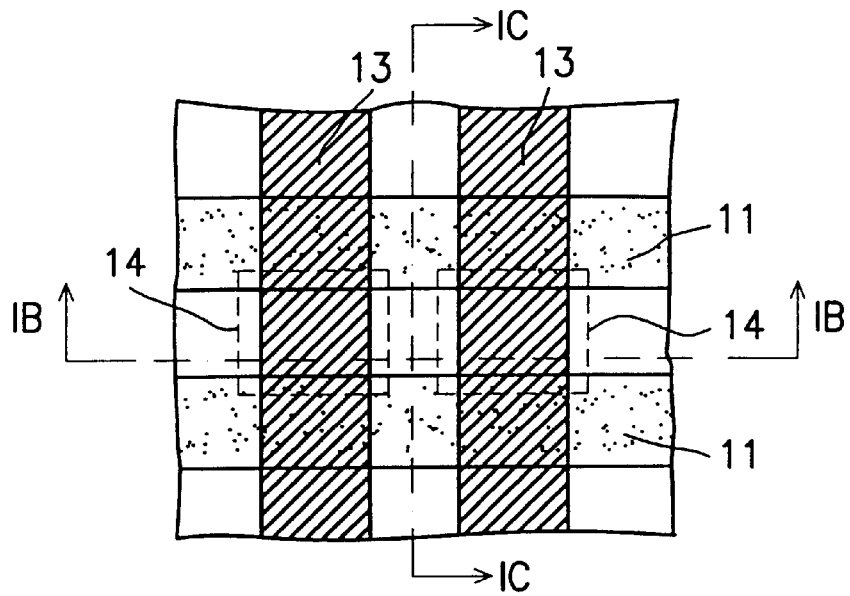
FIG. 1A is part of the top view showing a conventional ROM.
Figure 1B:
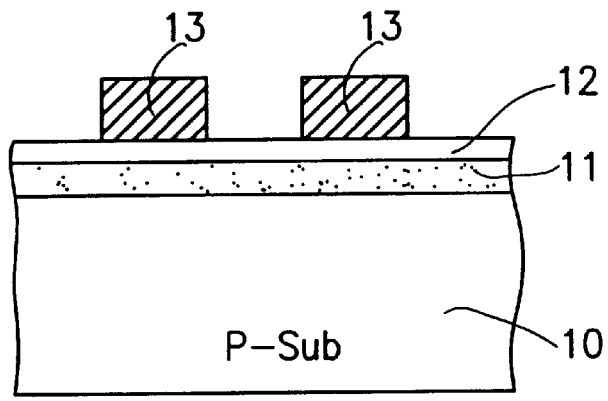
FIG. 1B is a cross-sectional view taken along line IB—IB of the ROM of FIG. 1A.
Figure 1C:
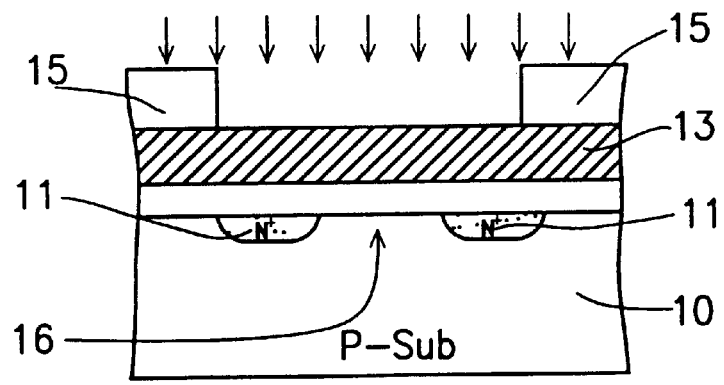
FIG. 1C is a cross-sectional view taken along line IC—IC of the ROM of FIG. 1A.
Figure 2A:
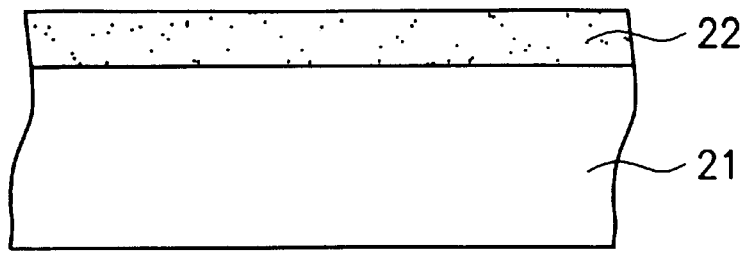
FIGS. 2A through 2F are cross-sectional views showing the manufacturing steps of a three-dimensional, deep-trench, high-density ROM according to a first preferred embodiment of the present invention.
Figure 2B:
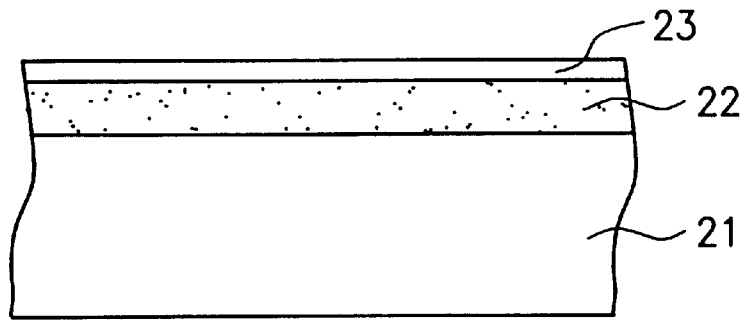

As shown in FIG. 2A, the method of manufacturing the ROM of the first embodiment of the present invention comprises implanting ions, such as, for example, arsenic ions having an energy of 50 to 100 KeV and an ion concentration of $10^{14}$ to $10^{16}$ atoms/cm$^2$, to form source/drain regions 22 above a silicon substrate 21. Referring to FIG. 2B, the method further includes placing substrate 21 inside a pipe oven, heated to a temperature of about 850 to 950 Celsius degree and containing wet oxygen to form a pad oxide layer 23 above source/drain regions 22.

Figure 2C:
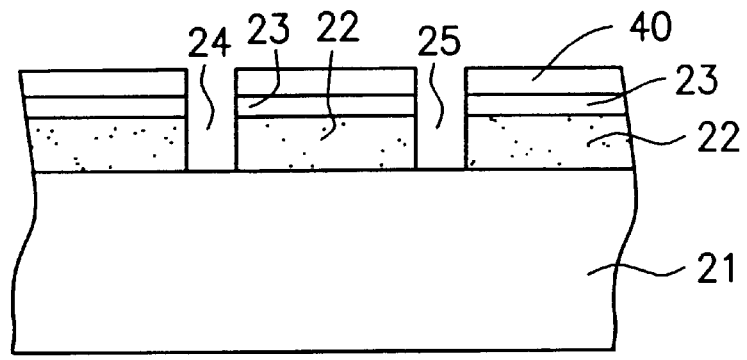
Figure 2D:
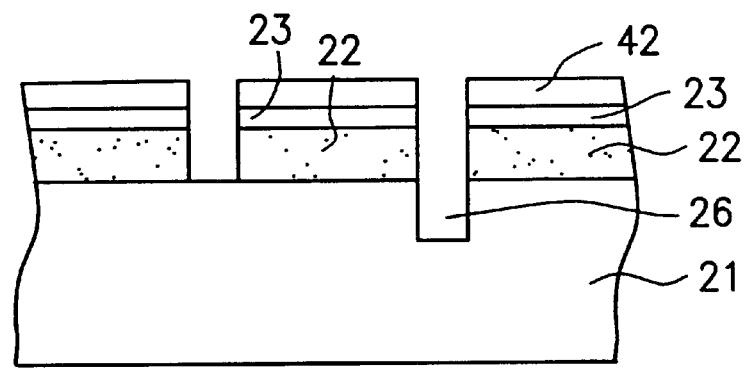

As shown in FIG. 2C, the method then comprises the steps of using a first photoresist layer 40 as a mask, and dry etching pad oxide layer 23 and the silicon substrate 21 to form conducting trenches 24 and non-conducting trenches 25, wherein each trench has a depth that is smaller or approximately equal to the thickness of each of source/drain regions 22. After removal of first photoresist layer 40, a second photoresist layer 42 is patterned on pad oxide layer 23 to expose only non-conducting trenches 25. Trenches 25 are then etched to form deeper openings 26, as shown in FIG. 2D.

Figure 2E:
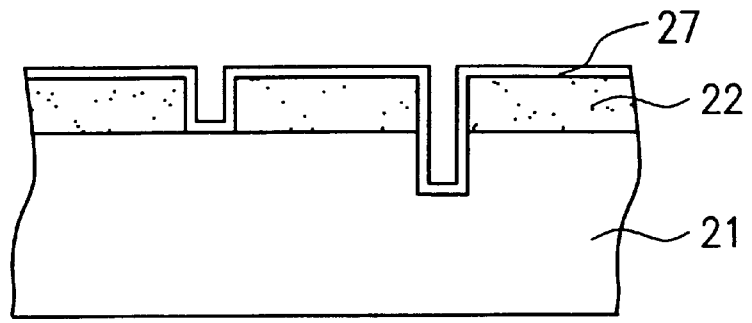
Figure 2F:
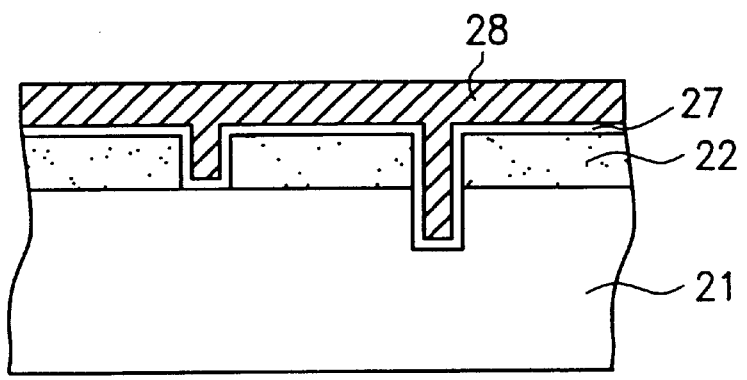
Figure 2G:
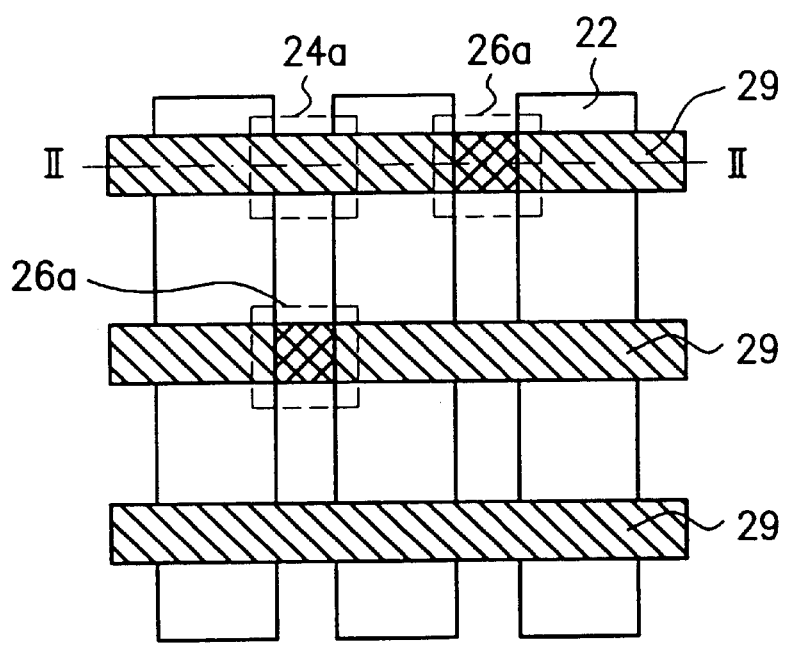
FIG. 2G is a partial top view showing the ROM according to the first preferred embodiment of the present invention.

Subsequently, after the pad oxide layer 23 is removed, another oxidation process is performed to form a gate oxide layer 27, having a thickness between 100 Å to 250 Å, over the silicon substrate surface, as shown in FIG. 2E. Finally, referring to FIG. 2F, the method comprises the steps of depositing a polysilicon layer on gate oxide layer 27, doping the polysilicon layer with impurities, and etching the doped polysilicon layer, using a mask, to form gate regions 28 extending perpendicular to the trenches and constituting word lines 29, as shown in FIG. 2G. It is noted that FIG. 2F is a cross-sectional view taken along line II—II of FIG. 2G.

In FIG. 2G, the parts labeled 22 are bit lines, area 24a enclosed by dash lines is a conducting memory cell, and areas 26a enclosed by dash lines are non-conducting memory cells. Subsequent ROM manufacturing steps follow the same steps as in the conventional method. Therefore, such steps are omitted here, since they would be known to those of ordinary skill in the art.

2. Second Embodiment

Figure 3A:
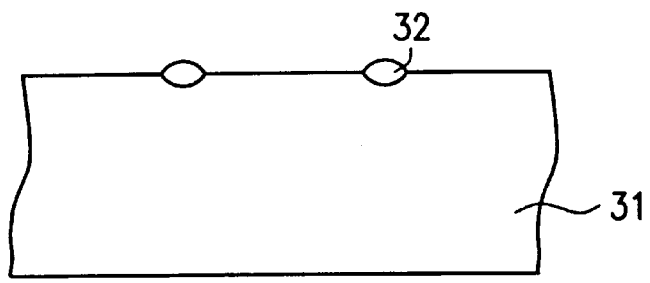
FIGS. 3A through 3E are cross-sectional views showing the manufacturing steps of a three-dimensional, deep-trench, high-density ROM according to a second preferred embodiment of the present invention.
Figure 3B:
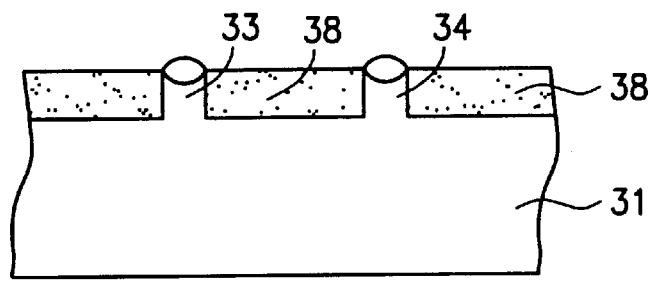

As shown in FIG. 3A, the method of manufacturing the ROM device in accordance with the second preferred embodiment comprises the step of forming field oxide layers 32 in memory cell channel regions 33 and 34, above a silicon substrate 31. Then, with the field oxide layers 32 acting as masks, ions such as, for example, arsenic ions having an energy of 50 to 100 KeV and an ion concentration of $10^{14}$ to $10^{16}$ atoms/cm$^2$, are implanted to form source/drain regions 38 above silicon substrate 31, as shown in FIG. 3B.

Figure 3C:
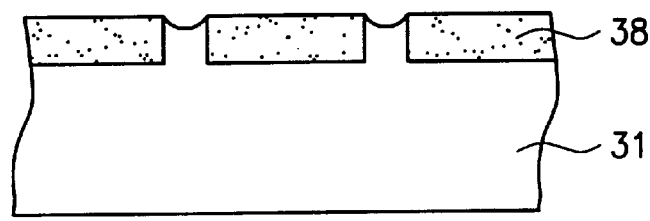

Thereafter, the method comprises the step of etching field oxide layers 32 to form concave arcs 39 in the surface of substrate 31, as shown in FIG. 3C. Concave arcs 39 act as channel regions that curve into the surface of substrate 31 at the conducting memory cell locations.

Figure 3D:
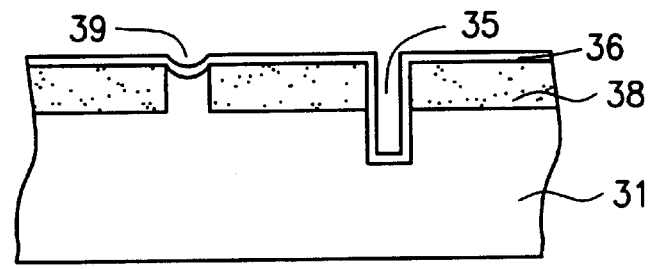

Referring to FIG. 3D, the method further includes the steps of using a photolithographic process to expose the non-conducting memory cells, and subsequently, etching the non-conducting memory cell locations to form a deep trench 35 having a depth that is deeper than the thickness of each of source/drain regions 38. Thereafter, an oxidation process is performed to form a gate oxide layer 36 over the entire surface of the device, as shown in FIG. 3D.

Figure 3E:
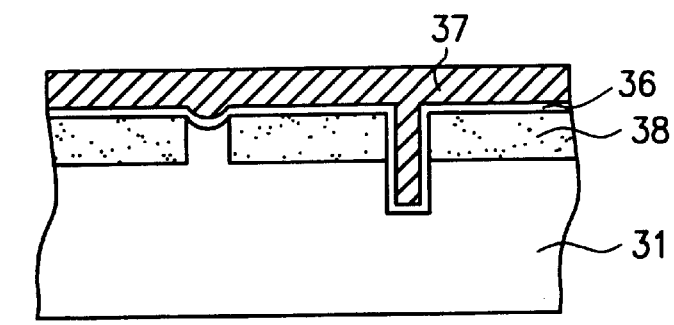

Finally, referring to FIG. 3E, the method comprises the steps of depositing a polysilicon layer to completely fill at least deep trench 35, doping the polysilicon layer with impurities, and etching the doped polysilicon layer to form gate regions 37 extending perpendicular to trenches 35 and constituting word lines. Subsequent ROM manufacturing steps follow the same steps as in the conventional method. Therefore, such steps are omitted here, since they should be known by those ordinary skill in the art.

In the three-dimensional, deep-trench, high-density ROM of the present invention, programming is performed by forming deeper trenches to define the OFF-state, nonconducting memory cells. Through such a ROM structure, misalignment problems generated by imprecise focusing are avoided. Hence, memory cell leakage and breakdown of the source/drain regions are reduced. Moreover, using the three-dimensional structural design for the ROM of the present invention greatly reduces the overall surface area occupation by ROM components, leading to a reduction in production cost and an increase in industrial value.

While the invention has been described by way of example and in terms of the preferred embodiments, it is to be understood that the invention is not limited to the disclosed embodiments. To the contrary, it is intended to cover various modifications and similar arrangements as would be apparent to those skilled in the art. Therefore, the scope of the appended claims, which define the invention, should be accorded the broadest interpretation so as to encompass all such modifications and similar structures.

What is claimed is:

1. A method for manufacturing a three-dimensional, deep-trench, high-density ROM, the method comprising the steps of:

performing ion implantation to form a plurality of parallel bit lines on a surface of a silicon substrate;

forming a photoresist layer to expose a plurality of channel regions of the substrate where non-conducting memory cells are desired;

performing an etching operation, using the photoresist layer as a mask, to form a trench in each of the channel regions, each trench having a trench depth larger than a depth of each of the bit lines;

forming a second photoresist layer to expose a plurality of channel regions of the substrate where conducting memory cells are desired using the second photoresist layer as a mask, performing an etching operation to form a plurality of shallow trenches, each shallow trench having a depth approximately equal to the depth of each of the bit lines sequentially forming a gate oxide layer and a polysilicon layer on the surface of the silicon substrate; and defining the gate oxide and polysilicon layers to form a plurality of word lines that are perpendicular to the plurality of bit lines.

2. The method according to claim 1, further comprising the steps of:
    prior to the ion implantation step, forming a plurality of field oxide layers as masks; and
    after the ion implantation step, removing the field oxide layers to create arc-shaped channel regions in the silicon substrate.

3. The method according to claim 1, wherein the ion implantation operation is performed using an energy of 50 to 100 KeV and an ion concentration of approximately 10 to $10^{16}$ atoms/cm$^2$.

4. The method according to claim 1, further comprising the steps of:
    before the photoresist layer formation step, forming a pad oxide layer on the substrate surface; and
    after the completion of the etching step, removing the pad oxide layer.

5. The method according to claim 4, wherein the pad oxide layer is formed in a pipe oven containing wet oxygen and at a temperature of 850° C. to 950° C.

* * * * *